(12) United States Patent
Walker et al.

(10) Patent No.: US 7,241,852 B2
(45) Date of Patent: Jul. 10, 2007

(54) FLUID RESISTANT SILICONE ENCAPSULANT

(75) Inventors: Elizabeth M. Walker, Nashua, NH (US); Jiazhong Luo, Waltham, MA (US); Rose Ann Schultz, Westford, MA (US); Katharine Louise Pearce, Andover, MA (US)

(73) Assignee: National Starch and Chemical Investment Holding Corporation, New Castle, DE (US)

( * ) Notice: Subject to any disclaimer, the term of this patent is extended or adjusted under 35 U.S.C. 154(b) by 225 days.

(21) Appl. No.: 10/901,713

(22) Filed: Jul. 29, 2004

(65) Prior Publication Data

US 2004/0266945 A1 Dec. 30, 2004

Related U.S. Application Data

(62) Division of application No. 09/993,589, filed on Nov. 6, 2001, now Pat. No. 6,841,647.

(51) Int. Cl.
*G08G 77/08* (2006.01)

(52) U.S. Cl. .............................. 528/15; 528/31; 528/35

(58) Field of Classification Search .................. 528/15, 528/31, 35
See application file for complete search history.

(56) References Cited

U.S. PATENT DOCUMENTS

| | | | |
|---|---|---|---|
| 4,587,137 A | 5/1986 | Eckberg | |
| 4,683,277 A | 7/1987 | Maxson | |
| 4,686,764 A | 8/1987 | Adams et al. | |
| 4,877,820 A | 10/1989 | Cowan | |
| 4,900,779 A | 2/1990 | Liebfried | |
| 4,902,731 A | 2/1990 | Liebfried | |
| 5,013,809 A | 5/1991 | Liebfried | |
| 5,037,932 A | 8/1991 | Maxson et al. | |
| 5,059,649 A | 10/1991 | Mason et al. | |
| 5,077,134 A | 12/1991 | Liebfried | |
| 5,086,147 A | 2/1992 | Ikeno et al. | |
| 5,118,735 A * | 6/1992 | Burnier | 524/99 |
| 5,124,423 A | 6/1992 | Liebfried | |
| 5,171,817 A * | 12/1992 | Barnum et al. | 528/15 |
| 5,196,498 A | 3/1993 | Liebfried | |
| 5,288,829 A | 2/1994 | Takago et al. | |
| 5,334,688 A | 8/1994 | Loo | |
| 5,349,037 A | 9/1994 | Fujiki et al. | |
| 5,354,830 A | 10/1994 | Williams | |
| 5,491,249 A | 2/1996 | Kostas | |
| 5,519,096 A | 5/1996 | Hara | |
| 5,529,822 A | 6/1996 | Togashi et al. | |
| 5,532,294 A | 7/1996 | Ikeno et al. | |
| 5,580,921 A | 12/1996 | Stepp et al. | |
| 5,645,941 A | 7/1997 | Meguriya et al. | |
| 5,705,586 A | 1/1998 | Sato et al. | |
| 5,753,751 A | 5/1998 | Liao et al. | |
| 5,837,774 A | 11/1998 | Tarumi et al. | |
| 6,124,407 A | 9/2000 | Lee et al. | |
| 6,359,098 B1 | 3/2002 | Fehn et al. | |

FOREIGN PATENT DOCUMENTS

| | | |
|---|---|---|
| EP | 0 482 404 | 4/1992 |
| EP | 0 676 450 | 10/1995 |
| EP | 0 539 201 | 3/1998 |
| EP | 1 081 192 | 3/2001 |
| EP | 1 122 284 | 8/2001 |
| EP | 0 688 762 | 11/2001 |
| EP | 1 167 453 | 1/2002 |
| EP | 1 170 320 | 1/2002 |
| EP | 1 172 415 | 1/2002 |

* cited by examiner

*Primary Examiner*—Margaret G. Moore
(74) *Attorney, Agent, or Firm*—Charles W. Almer

(57) ABSTRACT

A cross-linkable and cross-linked organosilicon polymer which is prepared from a mixture of a reactive polysiloxane resin having both reactive carbon-carbon double bonds and silicone-hydrogen groups, characterized by alternating structures of polycyclic polyene residue and cyclic (or tetrahedral) polysiloxane residue, and either vinyl terminated fluorine-containing polysiloxane or vinyl terminated phenyl-substituted siloxane. In an alternative embodiment, the polymer comprises a mixture of vinyl terminated phenyl-substituted polysiloxane and vinyl functional fluorosilicone elastomer with the cross-linkable and cross linked organosilicon polymer.

7 Claims, No Drawings

FLUID RESISTANT SILICONE ENCAPSULANT

This application is a divisional of patent application Ser. No. 09/993,589, filed Nov. 6, 2001, now U.S. Pat. No. 6,841,647.

FIELD OF THE INVENTION

The present invention relates to a fluid resistant silicone encapsulant in the form of a cross-linked and cross-linkable organosilicon polymer.

BACKGROUND OF THE INVENTION

It is known in the art to prepare cross-linked and cross-linkable silicone elastomers which are mainly comprised of two types of liquid polysiloxanes; one having vinyl (or general C=C) attached to the main chain and the other having hydrogen directly attached to silicone atoms. The addition curing (or crosslinking) reaction to form elastomeric materials occurs through hydrosilation in the presence of platinum or other metal-containing catalysts under room temperature or heating conditions. The substitution groups attached to the silicone chain can be methyl, phenyl, or fluoroalkyl (mostly trifluoropropyl). The fluoroalkyl substituted silicone (fluorosilicone) generally displays good chemical resistance and is commonly used as coating, potting or encapsulation material to protect electric/electronic components and assemblies.

The preparation of curable organosilicon prepolymers or cross-linked thermosetting polymers through a hydrosilation reaction of polycyclic polyene (providing an active C=C) and reactive cyclic polysiloxane or tetrahedral siloxysilane (providing SiH) in the presence of platinum-containing catalysts under heating is also known in the art. The resulting fully cross-linked materials display high rigidity and brittleness, a relatively high $T_g$, very high temperature resistance, water insensitivity and oxidation resistance. Examples of these types of polymers are found in U.S. Pat. Nos. 4,902,731 and 4,877,820.

Attempts have been made to reduce the brittleness and rigidity and increase the toughness of such polymers. U.S. Pat. No. 5,171,817 discloses such an organosilicone polymer in which reactive siloxane elastomers having carbon-carbon double bonds are added to the composition to form discontinuous phases in the rigid continuous polymer matrix after curing. For example, unsaturated diphenyl dimethyl siloxane elastomers are utilized to increase toughness and adhesion without reducing any of the other properties of the polymer. U.S. Pat. No. 5,196,498 discloses the use of a second silicone as a modifier to reduce the viscosity and brittleness of the crosslinked polymers. The second silicone compound, which has reactive hydrocarbyl group, is a cyclic siloxane and most preferably tetravinyltetramethyl cyclotetrasiloxane or pentavinylpentamethyl cyclopentasiloxane.

Accordingly, it would be advantageous for a polymer to have certain properties of known polymers without the brittleness and high rigidity that are usually associated therewith. It would be further advantageous for the polymer to have high acid and fuel resistance such that it would be suitable for use in fields which require polymers having more flexibility.

One potential use of such polymers is in the automotive industry as an encapsulant for items such as sensors, and especially as an encapsulant for pressure sensors. Such encapsulants must have an extremely high resistance to acids and fuels. For example, two fuels commonly utilized for material evaluation by the automobile industry, Fuel C and Fuel CM85, both cause polymer degradation to many known polymers. Fuel C is a hydrocarbon fuel which is approximately 50% by volume isooctane and 50% by volume toluene. Fuel CM85 comprises Fuel C containing 85% by volume methanol. In addition many materials are tested by the automotive industry for their resistance to used synthetic oil, which also causes polymer degradation. For the purpose of this patent, this is defined as Mobile 1 Oil, which has been used to lubricate an automotive engine for a minimum of 3,000 miles.

SUMMARY OF THE INVENTION

The present invention discloses a cross-linkable and cross-linked organosilicon polymer which is prepared from a mixture of a reactive polysiloxane resin having both reactive carbon-carbon double bonds and silicone-hydrogen groups, characterized by alternating structures of polycyclic polyene residue and cyclic polysiloxane (or tetrahedral siloxysilane) residue, hereafter referred to as a silicon hydrocarbon crosslinking agent, and either a vinyl terminated fluorine-containing polysiloxane or a vinyl terminated phenyl-substituted polysiloxane. In an alternative embodiment, the polymer comprises a mixture of vinyl terminated phenyl-substituted polysiloxane and vinyl terminated fluorine containing polysiloxane and the silicon hydrocarbon crosslinking agent.

DETAILED DESCRIPTION OF THE INVENTION

Upon exposure to harsh environments, such as those associated with fuels and/or acids and/or extreme temperatures, fluorosilicone and phenyl silicone polymers can breakdown and degrade. Consequently, elastomers comprising either material only provide moderate resistance to degradation upon exposure to fuels and/or acids and/or extreme temperatures. A combination of phenyl-silicone and/or fluorosilicone with certain forms of cross-linking agents has been found to result in a polymer which maintains its elastomeric properties during and after exposure to fuels and acids. Specifically, a vinyl terminated fluorine-containing polysiloxane and/or a vinyl terminated phenyl-substituted polysiloxane have been shown to be effective when combined with silicon hydrocarbon crosslinking agents. Exemplary vinyl terminated fluorine-containing polysiloxanes include Nusil PLY-7801, Nusil PLY (1-5)-7580, supplied by Nusil Technology, 1050 Cindy Lane, Carpinteria, Calif. 93013 and Gelest FMV-4031, supplied by Gelest, Inc., Tullytown, Pa. 19007-6308, USA. Exemplary vinyl terminated phenyl-substituted siloxanes include Nusil PLY (1-5)-7560, Nusil PLY-7664, Nusil PLY-7450, supplied by Nusil Technology; Gelest PMV-9925, Gelest PDV-0325, Gelest PDV-0331, Gelest PDV-0341, Gelest PDV-0346, Gelest PDV-0525, Gelest PDV-0541, Gelest PDV-1625, Gelest PDV-1631, Gelest PDV 1635, Gelest PDV-1641, Gelest PDV-2331, Gelest PDV-2335, supplied by Gelest, Inc; Andersil SF 1421; Andersil SF 1712; supplied by Anderson & Associates LLC., Summit, N.J. The reaction of many standard cross-linking agents, such as linear hydrosiloxane chain crosslinkers with either dimethyl or 3,3,3-trifluoropropyl substitution, with the polysiloxanes described above results in polymers with little or only moderate fuel and acid resistance. It has been determined that combining vinyl-terminated phenyl-substituted polysiloxane or vinyl terminated fluorine-containing polysiloxane with a silicon hydrocarbon crosslinking agent, provides a polymer with superior resistance to the harsh conditions imposed by fuels and acids.

Exemplary silicon hydrocarbon crosslinking agents are comprised of a cyclic or linear poly(organohydrosiloxane) having at least 30% of its silicon-hydrogen groups reacted with hydrocarbon residues derived from polycyclic polyenes. Numerous examples of poly(organohydrosiloxane) are known. One exemplary poly(organohydrosiloxane) is methylhydrocyclosiloxane, examples of typical structures include

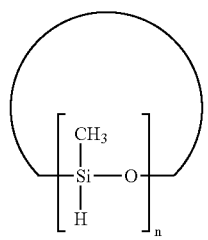

with typically D4 (n=4) and D5 (n=5). Further exemplary poly(organohydrosiloxanes) include Tetra- and penta-methylcyclotetrasiloxane; tetra, penta, hexa and hepta-methylcyclopentasiloxane; tetra-, penta- and hexa-methylcyclohexasiloxane; tetraethyl cyclotetrasiloxanes and tetraphenyl cyclotetrasiloxane; or blends thereof. Exemplary linear siloxanes include tetrakisdimethylsiloxysilane, tetrakisdiphenylsiloxysilane, and tetrakisdiethylsiloxysilane.

The silicon hydrocarbon crosslinking agents used in this invention are formed by the hydrosilation reaction of the poly(organohydrosiloxane) with a polycyclic polyene. The stoichiometric ratio of carbon-carbon double bonds to silicon-hydrogen linkages can be in the range of about 2:1 to 1:4. A preferred range is about 1:1. Useful cyclic polyenes are polycyclic hydrocarbon compounds having at least two non-aromatic, non-conjugated carbon-to-carbon double bonds. Exemplary compounds are well known in the art, and include cyclopentadiene oligomers such as dicyclopentadiene,

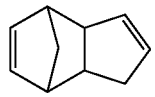

and tricyclopentadiene,

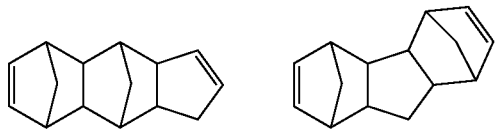

Further exemplary compounds include the Diels-Alder oligomers of the dicyclopentadiene and tricyclopentadiene species described above and substituted derivatives of the dicyclopentadiene and tricyclopentadiene species described above including dimethanohexahydronapthalene, methyl dicyclopentadiene; and any mixture of these compounds.

An exemplary silicon hydrocarbon crosslinking agent has the following structure

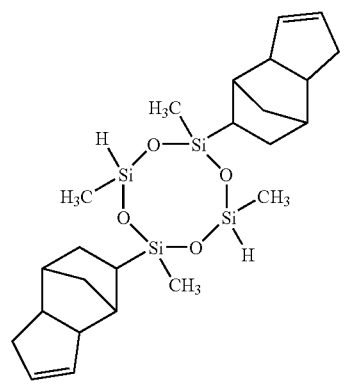

Hereafter, this molecule will be referred to as crosslinker SC-1. A further exemplary silicon hydrogen crosslinking agent has the following structure

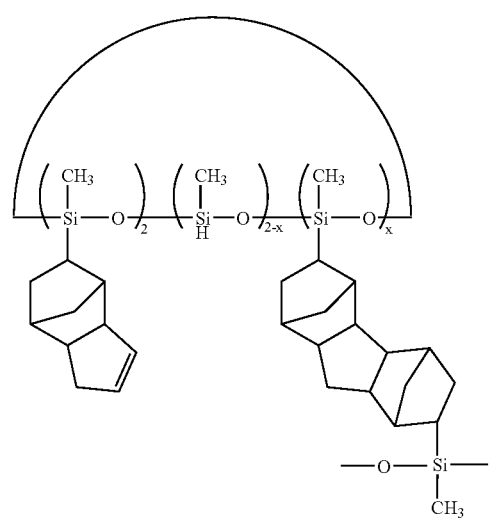

In a preferred formulation, the resulting polymer comprises about 64 to 99 wt % and most preferably about 77 to 90 wt % of a vinyl terminated fluorine-containing polysiloxane, which is about 20 to 90 mol % and most preferably about 20-60 mol % substituted with 3,3,3-trifluoropropyl groups, and about 1 to 36 wt % and most preferably about 10 to 23 wt % of the silicon hydrocarbon crosslinking agent described above. The resulting polymers are cross-linked silicone gels with the inherent elastomeric and high temperature properties of gel silicones, accompanied by superior strength and toughness. The resulting polymers additionally demonstrate excellent fuel resistance and good acid resistance. Materials of this type are useful as coating, potting or encapsulant materials to protect electric/electronic components and assemblies.

In another preferred formulation, the resulting polymer comprises about 1 to 40 wt % and most preferably 1-20 wt % of a vinyl terminated fluorine containing polysiloxane, which is about 20 to 90 mol % and most preferably about 20-60 mol % substituted with 3,3,3-trifluoropropyl groups, and about 60 to 99 wt % and most preferably about 80 to 99 wt % of the silicon hydrocarbon crosslinking agent described above. The resulting polymer is a cross-linked, rigid silicone which demonstrates reduced brittleness and improved toughness compared to the fully cross linked silicon hydrocarbon material. Furthermore the resulting polymer demonstrates increased hydrophobicity and lippophobicity indicating that this material will also exhibit resistance to fuels, oils and acids. This type of material is useful for the protective encapsulation of electric/electronic components where strength, toughness and mechanical stability are required.

In another preferred formulation, the resulting polymer comprises about 20 to 99 wt % and most preferably about 60 to 99 wt % of a vinyl terminated phenyl-substituted siloxane, which is about 1 to 40 mol % and most preferably about 2 to 20 mol % phenyl substituted, and about 1 to 80 wt % and most preferably about 1 to 40 wt % of the silicon hydrocarbon crosslinking agent described above. The resulting polymers are a range of cross-linked silicones which vary in hardness from soft gels to elastomers and rigid materials. The gel materials demonstrate superior strength and toughness while retaining the flexibility normally associated with this type of material. The rigid materials demonstrate a degree of flexibility and resilience beyond that expected of typical rigid elastomers. Both categories of material have been shown to be resistant to acid and alcohol based fuels. Materials of this type are useful as coating, potting or encapsulant materials to protect electric/electronic components and assemblies.

In another preferred formulation, the resulting polymer comprises about 64 to 99 wt % and most preferably about 77 to 90 wt % of a blend of a vinyl terminated fluorine-containing polysiloxane and a vinyl terminated phenyl-substituted polysiloxane and about 1 to 36 wt % and most preferably about 10 to 23 wt % of the silicon hydrocarbon crosslinking agent described above. The blend of of vinyl terminated fluorine-containing polysiloxane and a vinyl terminated phenyl-substituted polysiloxane comprises about 70 to 99 wt % and most preferably about 80 to 99 wt % of a vinyl terminated fluorine-containing polysiloxane, which is about 20 to 90 mol % and most preferably about 20 to 60 mol % substituted with 3,3,3-trifluoropropyl groups, and about 1 to 30 wt % and most preferably 1 to 20 wt % of a vinyl terminated phenyl-substituted siloxane, which is 1 to 40 mol % and most preferably about 2 to 20 mol % phenyl substituted. The resulting polymers are flexible cross-linked gels. The polymers would be expected to demonstrate similar levels of fuel, oil and acid resistance seen from the fluorosilicone in combination with the silicon hydrocarbon cross linker and the phenylsilicone in combination with the silicon hydrocarbon cross linker. Such polymers would also be expected to be useful as encapsulants, coatings and sealants for the automotive, avionics and general electronics markets.

The vinyl terminated fluorine-containing polysiloxane and/or the vinyl terminated phenyl-substituted polysiloxane and the silicon hydrocarbon crosslinking agents are combined via an addition-cure reaction. The vinyl terminated fluorine-containing polysiloxane is blended with a group VIII metal catalyst and a crosslinking agent. Exemplary group VIII metal catalysts include platinum based compounds including chloroplatinic acid, platinum chloride, dibenzonitrile platinum dichloride, platinum on carbon, platinum on silica, platinum on alumina and olefinic complexes. Further exemplary group VIII metal catalysts include rhodium based compounds, including $RhCl(PPh_3)_3$, $RhCl(CO)(PPh_3)_2$, ruthenium based compounds, including $Ru_3(CO)_{12}$, Iridium based compounds, including $IrCl(CO)(PPh_3)_4$ and paladium based compounds, including $Pd(PPh_3)_4$. Various additives may be added to the compositions of the inventions in order to enhance their practical usage. Useful additives include materials which are added for the purpose of enhancing the stability and flow properties of the formulation, materials which are added to control the reactivity of the formulation and further materials which are added to enhance the final application, for example adhesion, of the product. Specifically, these additives include fillers, which may be metallic, mineral or organic materials, compatibilizers, flow control agents, air release agents, cure rate modifiers, adhesion promoters and anti-oxidants. The formulation ingredients are blended together mechanically by different mixing methods to achieve uniform blends and de-aerated under vacuum. The resulting blend is placed in a mold suitable for the preparation of test pieces and cured at a temperature of 100 to 150° C. and a time of several minutes to several hours and most preferably a temperature of 130 to 150° C. and a time of 1 to 2 hours.

EXAMPLES

The invention can be illustrated by the following examples.

Examples 1 to 3 include gels prepared from a vinyl terminated fluorine containing polysiloxane and the silicon hydrocarbon cross linking agent.

Example 1

An encapsulant polymer gel was prepared from a vinyl terminated fluorine containing polysiloxane which is 50 mol % substituted with 3,3,3-trifluoropropyl groups and the silicon hydrocarbon cross linking agent described above, via a two-part process. To prepare the first part, a mixing vessel equipped with a low shear stirrer was charged with 50 wt % of compound A, which is the vinyl terminated polysiloxane, given in Table 1. With low speed stirring, compound B, which is the group VIII metal catalyst and other additives, given in Table 1 were added to the mixing vessel and blended for a period of 5-30 minutes at room temperature. Entrapped air was removed from the resulting blend by evacuating the mixture in a vacuum chamber capable of providing a vacuum of 29 mmHg. To prepare the second part, a further mixing vessel equipped with a low shear stirrer was charged with the remaining 50 wt % of compound A, which is the vinyl terminated polysiloxane, given in Table 1. With low speed stirring, compound C, which is the cross linking agent, was added to the reaction vessel and blended for a period of 5 to 30 minutes at room temperature. Entrapped air was removed from the resulting blend by evacuating the mixture in a vacuum chamber capable of providing a vacuum of 29 mmHg. The two parts thus prepared were mixed. The reaction mixture containing compounds A and B was added to the reaction mixture containing compounds A and C and mixed for 5 to 30 minutes at room temperature. Entrapped air was removed from the resulting blend by evacuating the mixture in a vacuum chamber capable of providing a vacuum of 29 mmHg. The resulting blend was poured into molds suitable for making test pieces and cured at 150° C. for 1 hour.

TABLE 1

| Compound | Material | Amount |
| --- | --- | --- |
| A | Nusil PLY-7801 (%) | 85.8 |
| B | Baysilone U Catalyst PT/L (%) | 0.3 |
|   | A-187 (%) | 1.0 |
| C | SC-1 (%) | 12.9 |

Baysilone U Catalyst PT/L is a group VIII catalyst supplied by GE Silicones, 260 Hudson River Road, Waterford, N.Y. 12188. A187 is a silane adhesion promoter supplied by OSi Specialties Inc., PO Box 38002, South Charleston, W.V., 25303.

Specimens were cut from each cured piece and measured for physical properties according to ASTM D2240 and ASTM D 412 (using Die D to cut the pieces and a tensile rate of 20inch/minute) and adhesion properties according to ASTM D413-82 (type B 90°, peel rate 0.2 inches per minute) with the results shown below.

| Hardness (Shore 00) | 40 |
|---|---|
| Tensile Strength (psi) | 56 |
| Elongation (%) | 420 |
| Adhesion to PPS (J/m$^2$) | 149 |
| Adhesion to Gold (J/m$^2$) | 175 |

Note
In general values associated with hardness, tensile strength, % elongation, toughness and adhesion are subject to approximately a 10% experimental error.

Specimens were also examined for heat resistance according to ASTM D 573 and chemical resistance according to ASTM D 471, part 15.4.1 (using Die D). The results are shown in Tables 2 to 5.

TABLE 2

Heat at 180° C.

| Time (hours) | Initial | 200 | 400 |
|---|---|---|---|
| Hardness (Shore 00) | 40 | 62 | 69 |
| Weight change (%) | — | −0.5% | −1.66 |

TABLE 3

Fuel C and Fuel CM 85 for 200 hours at 25° C.

|  | Fuel C | Fuel CM 85 |
|---|---|---|
| Tensile strength retention (%) | 164 | 126 |
| Elongation retention (%) | 146 | 125 |
| Adhesion to PPS retention (%) | 159 | 146 |
| Adhesion to gold retention (%) | 150 | 120 |

TABLE 4

Mobil 1 Oil at 140° C.

| Time (hours) | 200 | 400 | 600 |
|---|---|---|---|
| Tensile strength retention (%) | 112 | 90 | 110 |
| Elongation retention (%) | 121 | 102 | 102 |
| Adhesion to PPS retention (%) | 85 | 82 | 83 |
| Weight gain (%) | +2.3 | +2.7 | — |

TABLE 5

Nitric and sulfuric acid at pH 1.6 and 85° C.

|  | Nitric acid | | Sulfuric acid | |
|---|---|---|---|---|
| Time (hours) | 620 | 1000 | 620 | 1000 |
| Tensile strength retention (%) | 104 | 121 | 122 | 100 |
| Elongation retention (%) | 83 | 95 | 92 | 80 |
| Adhesion to PPS retention (%) | 100 | 84 | 106 | 106 |
| Adhesion to gold retention (%) | 88 | 80 | 73 | 87 |

The performance properties detailed above describing Example 1 illustrate that this vinyl terminated fluorine containing polysiloxane in combination with the silicon hydrocarbon crosslinker is a soft gel material with excellent strength, flexibility and adhesion properties. Moreover, excellent retention of these properties is observed on exposure of this material to fuels, oils and acids.

Example 2

Example 2 represents four formulations which demonstrate that similar properties to the material described in Example 1 can be achieved for a range of levels of the silicon hydrocarbon crosslinker. Encapsulant polymer gels were prepared from varying ratios of a vinyl terminated fluorine containing polysiloxane which is 50 mol % substituted with 3,3,3-trifluoropropyl groups and the silicon hydrocarbon cross linking agent described above. Materials in Example 2 were formulated according to the method described in Example 1, via a two part process. Compound B shown in Table 6 was blended with 50 wt % of compound A. Compound C shown in Table 6 was blended with the remaining 50 wt % of compound A. The two parts were mixed, de-aerated, poured into molds suitable for making test pieces and cured at 150° C. for 1 hour.

TABLE 6

| Compound | Material | Ex 2.1 | Ex 2.2 | Ex 2.3 | Ex 2.4 |
|---|---|---|---|---|---|
| A | Nusil PLY-7801 (%) | 93.70 | 86.67 | 81.70 | 75.70 |
| B | PT-L (%) | 0.30 | 0.30 | 0.30 | 0.30 |
| C | SC-1 (%) | 6.00 | 13.03 | 18.00 | 24.00 |

Specimens were cut from each cured piece and measured for physical properties according to ASTM D2240 and ASTM D 412 (using Die D to cut the pieces and a tensile rate of 20inch/minute) with the results shown below.

|  | Ex 2.1 | Ex 2.2 | Ex 2.3 | Ex 2.4 |
|---|---|---|---|---|
| Hardness (Shore 00) | 56 | 59 | 63 | 65 |
| Tensile strength (psi) | 45.39 | 77.79 | 106.4 | 70.68 |
| Elongation (%) | 210.7 | 218.8 | 194.9 | 139.5 |
| Toughness (in · lbs/in$^3$) | 41.07 | 66.09 | 85.43 | 47.44 |

Specimens were also examined for heat resistance according to ASTM D 573 and chemical resistance according to ASTM D 471, part 15.4.2, (using Die D). The results are shown in Tables 7 to 10.

TABLE 7

Heat for 200 hours at 180° C.

|  | Ex 2.1 | Ex 2.2 | Ex 2.3 | Ex 2.4 |
|---|---|---|---|---|
| Hardness (Shore 00) | 69 | 69.5 | 72 | 74 |
| Tensile strength retention (%) | 152 | 137 | 110 | 106 |
| Elongation retention (%) | 58 | 58 | 54 | 44 |
| Toughness retention (%) | 94 | 77 | 63 | 42 |

TABLE 8

Fuel C for 200 hours at 25° C.

|  | Ex 2.1 | Ex 2.2 | Ex 2.3 | Ex 2.4 |
|---|---|---|---|---|
| Hardness (Shore 00) | 57 | 59 | 63.5 | 65 |
| Tensile strength retention (%) | 134 | 120 | 122 | 114 |
| Elongation retention (%) | 107 | 105 | 104 | 106 |
| Toughness retention (%) | 178 | 145 | 133 | 118 |

TABLE 9

Fuel CM 85 for 200 hours at 25° C.

|  | Ex 2.1 | Ex 2.2 | Ex 2.3 | Ex 2.4 |
|---|---|---|---|---|
| Hardness (Shore 00) | 56.5 | 59 | 63 | 65 |
| Tensile strength retention (%) | 117 | 94 | 118 | 120 |
| Elongation retention (%) | 107 | 96 | 106 | 108 |
| Toughness retention (%) | 139 | 100 | 125 | 123 |

TABLE 10

Nitric acid for 120 hours at pH 1.0, 85° C.

|  | Ex 2.1 | Ex 2.2 | Ex 2.3 | Ex 2.4 |
|---|---|---|---|---|
| Hardness (Shore 00) | — | 60 | 65 | 64 |
| Tensile strength retention (%) | — | 105 | 111 | 88 |
| Elongation retention (%) | — | 97 | 99 | 89 |
| Toughness retention (%) | — | 99 | 104 | 80 |

Example 3

Example 3 represents a further formulation which demonstrates that similar properties to the material described in Example 1 can be achieved for vinyl terminated fluorine containing polysiloxanes with alternative levels of 3,3,3-trifluoropropyl substitution. An encapsulant polymer gel was prepared from a vinyl terminated fluorine containing polysiloxane which is 40 mol % substituted with 3,3,3-trifluoropropyl groups and the silicon hydrocarbon cross linking agent described above. The material in Example 3 was formulated according to the method described in Example 1, via a two part process. Compound B shown in Table 11 was blended with 50 wt % of compound A. Compound C shown in Table 11 was blended with the remaining 50 wt % of compound A. The two parts were mixed, de-aerated, poured into molds suitable for making test pieces and cured at 150° C. for 1 hour.

TABLE 11

| Compound | Material | |
|---|---|---|
| A | FMV-4031 (%) | 81.70 |
| B | PT-L (%) | 0.30 |
| C | SC-1 (%) | 18.00 |

Specimens were cut from each cured piece and measured for physical properties according to ASTM D2240 and ASTM D 412 (using Die D to cut the pieces and a tensile rate of 20 inch/minute) with the results shown below.

| Hardness (Shore 00) | 60 |
|---|---|
| Tensile strength (psi) | 89 |
| Elongation (%) | 268 |
| Toughness (in · lbs/in³) | 104 |

Specimens were also examined for heat resistance according to ASTM D 573 and chemical resistance according to ASTM D 471, part 15.4.2, (using Die D). The results are shown in Table 12.

TABLE 12

Heat and chemical resistance

| Conditions<br>Time (hours) | Heat<br>180° C.<br>200 | Fuel C<br>25° C.<br>200 | Fuel CM 85<br>25° C.<br>200 | Nitric acid<br>pH 1.0,<br>85° C. 120 |
|---|---|---|---|---|
| Hardness (Shore 00) | 67 | 62 | 61 | 63 |
| Tensile strength retention (%) | 139 | 91 | 93 | 119 |
| Elongation retention (%) | 53 | 93 | 97 | 97 |
| Toughness retention (%) | 67 | 94 | 94 | 107 |

Comparative Example 1

A further encapsulant polymer gel was prepared from a vinyl terminated fluorine containing polysiloxane which is 50 mol % substituted with 3,3,3-trifluoropropyl groups and a cross linking agent that is a linear hydrosiloxane with dimethyl substitution, Masil XL-1, supplied by PPG Industries Inc., Specialty Chemicals, 3938 Porelt Drive, Gurnee, Ill. 60031. A further encapsulant polymer gel was prepared from a vinyl terminated fluorine containing polysiloxane which is 50 mol % substituted with 3,3,3-trifluoropropyl groups and a cross linking agent that is a linear hydrosiloxane with 3,3,3-trifluoropropyl substitution, SMP 9951-22, supplied by Nusil Technology, 1050 Cindy Lane, Carpinteria, Calif. 93013. Materials in Comparative Example 1 were formulated according to the method described in Example 1, via a two part process. Compound B shown in Table 13 was blended with 50 wt % of compound A. Compound C shown in Table 13 was blended with the remaining 50 wt % of compound A. The two parts were mixed, de-aerated, poured into molds suitable for making test pieces and cured at 150° C. for 1 hour.

TABLE 13

| Compound | Material | CEx 1.1 | CEx 1.2 |
|---|---|---|---|
| A | Nusil PLY-7801 (%) | 81.70 | 81.70 |
| B | PT-L (%) | 0.30 | 0.30 |
| C | Masil XL-1 (%) | 18.00 | — |
|  | SMP 9951-22 (%) | — | 18.00 |

Specimens were cut from each cured piece and measured for physical properties according to ASTM D2240 and ASTM D 412 (using Die D to cut the pieces and a tensile rate of 20inch/minute) with the results shown below.

|  | CEx 1.1 | CEx 1.2 |
|---|---|---|
| Hardness (Shore 00) | 59 | 46 |
| Tensile strength (psi) | 38 | 35 |

-continued

|  | CEx 1.1 | CEx 1.2 |
|---|---|---|
| Elongation (%) | 117 | 236 |
| Toughness (in · lbs/in$^3$) | 39 | 49 |

Specimens were also examined for heat resistance according to ASTM D 573 and chemical resistance according to ASTM D 471, part 15.4.2, (using Die D). The results are shown in Tables 14 to 17.

TABLE 14

Heat for 200 hours at 180° C.

|  | CEx 1.1 | CEx 1.2 |
|---|---|---|
| Hardness (Shore 00) | 73 | 54 |
| Tensile strength retention (%) | 108 | 45 |
| Elongation retention (%) | 37 | 50 |
| Toughness retention (%) | 14 | 6 |

TABLE 15

Fuel C for 200 hours at 25° C.

|  | CEx 1.1 | CEx 1.2 |
|---|---|---|
| Hardness (Shore 00) | 62.5 | 53 |
| Tensile strength retention (%) | 83 | 64 |
| Elongation retention (%) | 87 | 71 |
| Toughness retention (%) | 40 | 36 |

TABLE 16

Fuel CM 85 for 200 hours at 25° C.

|  | CEx 1.1 | CEx 1.2 |
|---|---|---|
| Hardness (Shore 00) | 61 | 45 |
| Tensile strength retention (%) | 94 | 75 |
| Elongation retention (%) | 69 | 86 |
| Toughness retention (%) | 44 | 56 |

TABLE 17

Nitric acid for 120 hours at pH 1.0, 85° C.

|  | CEx 1.1 | CEx 1.2 |
|---|---|---|
| Hardness (Shore 00) | 53 | 42 |
| Tensile strength retention (%) | 28 | 67 |
| Elongation retention (%) | 110 | 94 |
| Toughness retention (%) | 8 | 44 |

The performance properties detailed above describing Comparative Example 1 illustrate that this vinyl terminated fluorine containing polysiloxane in combination with cross linking agents that are linear hydrosiloxanes with either dimethyl or 3,3,3-trifluoropropyl substitution are soft gel materials with inferior strength and toughness compared with Examples 1 to 3. Moreover these properties are observed to deteriorate on exposure of this material to both fuels and acids, indicating polymer degradation.

Example 4

Example 4 describes a range of rigid polymers prepared from a vinyl terminated fluorine containing polysiloxane and the silicon hydrocarbon cross linking agent. These were prepared from varying ratios of a vinyl terminated fluorine containing polysiloxane which is 50 mol % substituted with 3,3,3-trifluoropropyl groups and the silicon hydrocarbon cross linking agent described above. Materials in Example 4 were formulated according to the method described in Example 1, via a two part process. Compound B shown in Table 18 was blended with 50 wt % of compound A. Compound C shown in Table 18 was blended with the remaining 50 wt % of compound A. The two parts were mixed and de-aerated.

TABLE 18

| Compound | Material | Ex 4.1 | Ex 4.2 | Ex 4.3 | Ex 4.4 |
|---|---|---|---|---|---|
| A | Nusil PLY-7801 (%) | — | 4.99 | 9.97 | 19.94 |
| B | PT-L (%) | 0.30 | 0.30 | 0.30 | 0.30 |
| C | SC-1 (%) | 99.70 | 94.72 | 89.73 | 79.76 |

Films coated on glass slides were prepared by drawing down material using 2 mil tape to define the film thickness. These films were cured at 150° C. for 1 hour. Contact angle data for water and toluene on the films were measured by the sessile drop method: a drop of the test fluid was placed onto the film surface in air and the contact angle was measured after ten seconds at 25° C., with the results shown below.

|  |  | Ex 4.1 | Ex 4.2 | Ex 4.3 | Ex 4.4 |
|---|---|---|---|---|---|
| Hardness (Shore D) |  | 71 | 68.3 | 64.3 | 62.3 |
| Contact angle: | Water | 78° | 78° | 85° | 86° |
|  | Toluene | 0° | 23° | 25° | 30° |

The performance properties detailed above describing Example 4 illustrate that the incorporation of this vinyl terminated fluorine containing polysiloxane with the silicon hydrocarbon crosslinker results in a rigid polymer with reduced hardness compared with the fully crosslinked silicon hydrocarbon material, thus the polymer would be expected to have reduced brittleness and improved toughness compared with the fully crosslinked silicon hydrocarbon material. Moreover, Example 4 demonstrates that this improved toughness is accompanied by an increase in contact angle for both water and toluene, indicating that the polymer has increased hydrophobicity and lippophobicity, thus the polymer would be expected to have improved resistance to fuels, oils and acids.

Examples 5 to 7 include elastomers prepared from a vinyl terminated phenyl substituted polysiloxanes and the silicon hydrocarbon cross linking agent.

Example 5

An encapsulant polymer elastomer was prepared from a vinyl terminated phenyl-substituted polysiloxane which is 6 mol % substituted phenyl groups and the silicon hydrocarbon cross linking agent described above. The material in Example 5 was formulated according to the method described in Example 1, via a two part process. Compound B shown in Table 19 was blended with 50 wt % of compound A. Compound C shown in Table 19 was blended with the remaining 50 wt % of compound A. The two parts were mixed, de-aerated, poured into molds suitable for making test pieces and cured at 150° C. for 1 hour.

TABLE 19

| Compound | Material | |
|---|---|---|
| A | Andersil SF 1721 (%) | 86.9 |
| B | PT-L (%) | 0.1 |
| C | SC-1 (%) | 13.0 |

Specimens were cut from each cured piece and measured for physical properties according to ASTM D2240 and ASTM D 412 (using Die D to cut the pieces and a tensile rate of 20inch/minute) and adhesion properties according to ASTM D-413-82 (type B 90°, peel rate 0.2 inches per minute) with the results shown below.

| | |
|---|---|
| Hardness (Shore A) | 14 |
| Tensile Strength (psi) | 130 |
| Elongation (%) | 285 |
| Adhesion to PPS (J/m$^2$) | 121 |
| Adhesion to Gold (J/m$^2$) | 86 |

Specimens were also examined for heat resistance according to ASTM D 573 and chemical resistance according to ASTM D 471, part 15.4.1 (using Die D). The results are shown in Tables 20 to 22.

TABLE 20

Heat at 180° C.

| Time (hours) | initial | 200 |
|---|---|---|
| Hardness (Shore A) | 14 | 28 |
| Weight change (%) | — | −1.76 |

TABLE 21

Fuel CM 85 for 150–200 hours at 25° C.

| | Fuel CM 85 |
|---|---|
| Tensile strength retention (%) | 78 |
| Elongation retention (%) | 94 |
| Adhesion to gold retention (%) | 124 |

TABLE 22

Sulfuric Acid at pH 1.6, at 85° C.

| | Sulfuric acid | |
|---|---|---|
| Time (hours) | 620 | 1000 |
| Tensile strength retention (%) | 69 | 95 |
| Elongation retention (%) | 77 | 166 |
| Adhesion to gold retention (%) | 122 | 122 |

The performance properties detailed above describing Example 5 illustrate that this vinyl terminated phenyl substituted polysiloxane in combination with the silicon hydrocarbon crosslinker is an elastomer with excellent strength and adhesion properties. Moreover, excellent retention of these properties is observed on exposure of this material to alcohol based fuels and acids.

Example 6

Example 6 represents a further formulation which demonstrates that similar properties to the material described in Example 5 can be achieved for an increased level of the silicon hydrocarbon crosslinker. An encapsulant polymer elastomer was prepared from a vinyl terminated phenyl-substituted polysiloxane which is 6 mol % substituted with phenyl groups and the silicon hydrocarbon cross linking agent described above. The material in Example 6 was formulated according to the method described in Example 1, via a two part process. Compound B shown in Table 23 was blended with 50 wt % of compound A. Compound C shown in Table 23 was blended with the remaining 50 wt % of compound A. The two parts were mixed, de-aerated, poured into molds suitable for making test pieces and cured at 150° C. for 1 hour.

TABLE 23

| Compound | Material | |
|---|---|---|
| A | Andsil SF 1721 (%) | 81.70 |
| B | PT-L (%) | 0.30 |
| C | SC-1 (%) | 18.00 |

Specimens were cut from each cured piece and measured for physical properties according to ASTM D2240 and ASTM D 412 (using Die D to cut the pieces and a tensile rate of 20inch/minute) with the results shown below.

| | |
|---|---|
| Hardness (Shore 00) | 69 |
| Tensile strength (psi) | 126 |
| Elongation (%) | 172 |

Specimens were also examined for heat resistance according to ASTM D 573 and chemical resistance according to ASTM D 471, part 15.4.2 (using Die D). The results are shown in Table 24.

TABLE 24

| Conditions | Heat 180° C. | Fuel C 25° C. | Fuel CM 85 25° C. | Nitric acid pH 1.0, 85° C. |
|---|---|---|---|---|
| Time (hours) | 200 | 200 | 200 | 120 |
| Hardness (Shore 00) | 81 | 70 | 68 | 70 |
| Tensile strength retention (%) | 211 | 122 | 101 | 132 |
| Elongation retention (%) | 46 | 106 | 90 | 87 |

The performance properties detailed above describing Example 6 illustrate that this vinyl terminated phenyl substituted polysiloxane in combination with an increased level of the silicon hydrocarbon crosslinker is an elastomer with excellent strength and adhesion properties. Moreover, excellent retention of these properties is observed on exposure of this material to fuels and acids.

Example 7

Example 7 represents six formulations which demonstrate that similar benefits observed for the materials described in Examples 5 and 6 can be achieved with vinyl terminated phenyl substituted polysiloxanes with alternative levels of phenyl substitution and for a range of levels of the silicon hydrocarbon crosslinker. Encapsulant polymer elastomers were prepared from varying ratios of a vinyl terminated phenyl-substituted polysiloxane which is 15 mol % substituted phenyl groups and the silicon hydrocarbon cross linking agent described above. Materials in Example 7 were formulated according to the method described in Example 1, via a two part process. Compound B shown in Table 25 was blended with 50 wt % of compound A. Compound C shown in Table 25 was blended with the remaining 50 wt % of compound A. The two parts were mixed, de-aerated, poured into molds suitable for making test pieces and cured at 150° C. for 1 hour.

TABLE 25

| Compound | Material | Ex 7.1 | Ex 7.2 | Ex 7.3 | Ex 7.3 | Ex 7.4 | Ex 7.5 |
|---|---|---|---|---|---|---|---|
| A | Nusil PLY-7664 (%) | 93.70 | 86.67 | 81.70 | 75.70 | 69.70 | 59.70 |
| B | PT-L (%) | 0.30 | 0.30 | 0.30 | 0.30 | 0.30 | 0.30 |
| C | SC-1 (%) | 6.00 | 13.03 | 18.00 | 24.00 | 30.00 | 40.00 |

Specimens were cut from each cured piece and measured for physical properties according to ASTM D2240 and ASTM D 412 (using Die D to cut the pieces and a tensile rate of 20 inch/minute with the results shown below.

|  | Ex 7.1 | Ex 7.2 | Ex 7.3 | Ex 7.3 | Ex 7.4 | Ex 7.5 |
|---|---|---|---|---|---|---|
| Hardness (Shore 00) | 62.6 | 70.4 | 74.6 | 83.2 | — | — |
| Hardness (Shore A) | — | — | — | — | 53 | 67 |
| Tensile strength (psi) | 40 | 142 | 197 | 482 | 523 | 672 |
| Elongation (%) | 180 | 173 | 131 | 131 | 95 | 64 |
| Toughness (in · lbs/in³) | 37 | 95 | 99 | 236 | 228 | 227 |

Specimens were also examined for heat resistance according to ASTM D 573 and chemical resistance according to ASTM D 471, part 15.4.2 (using Die D). The results are shown in Tables 26 to 29.

TABLE 26

Heat for 200 hours at 180° C.

|  | Ex 7.1 | Ex 7.2 | Ex 7.3 | Ex 7.3 | Ex 7.4 | Ex 7.5 |
|---|---|---|---|---|---|---|
| Hardness (Shore 00) | 72 | 82 | 86 | 90 | — | — |
| Hardness (Shore A) | — | — | — | — | 77 | 87 |
| Tensile strength retention (%) | 216 | 168 | 147 | 98 | 98 | 126 |
| Elongation retention (%) | 45 | 38 | 36 | 29 | 27 | 28 |

TABLE 27

Fuel C for 200 hours at 25° C.

|  | Ex 7.1 | Ex 7.2 | Ex 7.3 | Ex 7.3 | Ex 7.4 | Ex 7.5 |
|---|---|---|---|---|---|---|
| Hardness (Shore 00) | 60 | 71 | 71 | 82.5 | — | — |
| Hardness (Shore A) | — | — | — | — | 77 | 87 |
| Tensile strength retention (%) | 79 | 87 | 118 | 107 | — | — |
| Elongation retention (%) | 94 | 97 | 109 | 102 | — | — |

TABLE 28

Fuel CM 85 for 200 hours at 25° C.

|  | Ex 7.1 | Ex 7.2 | Ex 7.3 | Ex 7.3 | Ex 7.4 | Ex 7.5 |
|---|---|---|---|---|---|---|
| Hardness (Shore 00) | 61 | 71 | 75 | 85 | — | — |
| Hardness (Shore A) | — | — | — | — | 54 | 69 |
| Tensile strength retention (%) | 127 | 94 | 125 | 106 | 103 | 122 |
| Elongation retention (%) | 94 | 90 | 105 | 97 | 101 | 120 |

TABLE 29

Nitric acid for 120 hours at pH 1.0, 85° C.

|  | Ex 7.1 | Ex 7.2 | Ex 7.3 | Ex 7.3 | Ex 7.4 | Ex 7.5 |
|---|---|---|---|---|---|---|
| Hardness (Shore 00) | 62 | 73 | 77 | 85 | — | — |
| Hardness (Shore A) | — | — | — | — | 59 | 77 |
| Tensile strength retention (%) | 189 | 125 | 120 | 105 | 117 | 124 |
| Elongation retention (%) | 110 | 88 | 89 | 83 | 86 | 84 |

The performance properties detailed above describing Example 7 illustrate that this vinyl terminated phenyl substituted polysiloxane in combination with the silicon hydrocarbon crosslinker can be a soft gel material with excellent strength and toughness. Moreover, good retention of these properties is observed on exposing these materials to fuels and acids. The heat resistance of this material is equal to or better than a vinyl terminated phenyl substituted polysiloxane in combination with a cross linking agent that is a linear hydrosiloxane with dimethyl substitution (see Comparative Example 2). Furthermore, at increased levels of the silicon hydrocarbon crosslinker, more rigid materials are generated which demonstrate greatly increased levels of toughness while remaining flexible. Moreover, good retention of these properties is observed on exposing these materials to acids and alcohol based fuels.

Comparative Example 2

A further encapsulant polymer gel was prepared from a vinyl terminated phenyl-substituted polysiloxane which is 15 mol % substituted phenyl groups and a cross linking agent that is a linear hydrosiloxane with dimethyl substitution. The material in Comparative Example 2 was formulated according to the method described in Example 1, via a two part process. Compound B shown in Table 30 was blended with 50 wt % of compound A. Compound C shown in Table 30 was blended with the remaining 50 wt % of compound A. The two parts were mixed, de-aerated, poured into molds suitable for making test pieces and cured at 150° C. for 1 hour.

TABLE 30

| Compound | Material | |
|---|---|---|
| A | Nusil PLY-7664 (%) | 81.70 |
| B | PT-L (%) | 0.30 |
| C | Masil XL-1 (%) | 18.00 |

Specimens were cut from each cured piece and measured for physical properties according to ASTM D2240 and ASTM D 412 (using Die D to cut the pieces and a tensile rate of 20inch/minute) with the results shown below.

| Hardness (Shore 00) | 61.8 |
|---|---|
| Tensile strength (psi) | 61.42 |
| Elongation (%) | 251.2 |
| Toughness (in · lbs/in$^3$) | 63.21 |

Specimens were also examined for heat resistance according to ASTM D 573 and chemical resistance according to ASTM D 471, part 15.4.2 (using Die D). The results are shown in Table 31.

TABLE 31

Heat and Chemical resistance

| | Conditions | | | |
|---|---|---|---|---|
| | Heat 180° C. | Fuel C 25° C. | Fuel CM 85 25° C. | Nitric acid pH 1.0, 85° C. |
| | Time (hours) | | | |
| | 200 | 200 | 200 | 120 |
| Hardness (Shore 00) | 78 | 69 | 63 | 71 |
| Tensile strength retention (%) | 299 | 117 | 105 | 206 |
| Elongation retention (%) | 32 | 74 | 81 | 66 |

The performance properties detailed above describing Comparative Example 2 illustrate that this vinyl terminated phenyl substituted polysiloxane in combination with a cross linking agent that is a linear hydrosiloxane with dimethyl substitution is a soft gel material with inferior strength and toughness compared with Examples 5 to 7. Moreover these properties are observed to deteriorate on exposure of this material to both fuels and acids, indicating polymer degradation.

Example 8

Example 8 represents two formulations in which a blend of a vinyl terminated fluorine containing polysiloxane and a vinyl terminated phenyl substituted polysiloxane is used in conjunction with the silicon hydrocarbon crosslinker. Encapsulant polymer gels were prepared from blends of a vinyl terminated fluorine containing polysiloxane, which is 50 mol % substituted with 3,3,3-trifluoropropyl groups, and a vinyl terminated phenyl-substituted polysiloxane, which is 15 mol % substituted phenyl groups, in different ratios, and the silicon hydrocarbon cross linking agent described above. Materials in Example 8 were formulated according to the method described in Example 1, via a two part process. Compound B shown in Table 32 was blended with 50 wt % each of compounds A. Compound C shown in Table 32 was blended with the remaining 50 wt % each of compounds A. The two parts were mixed, de-aerated, poured into molds suitable for making test pieces and cured at 150° C. for 1 hour.

TABLE 32

| Compound | Material | Ex 8.1 | Ex 8.2 |
|---|---|---|---|
| A | Nusil PLY-7801 (%) | 65.36 | 73.53 |
| | Nusil PLY-7664 (%) | 16.34 | 8.17 |
| B | PT-L (%) | 0.30 | 0.30 |
| C | SC-1 (%) | 18.00 | 18.00 |

Specimens were cut from each cured piece and measured for physical properties according to ASTM D2240 and ASTM D 412 (using Die D to cut the pieces and a tensile rate of 20inch/minute) with the results shown below.

|  | Ex 8.1 | Ex 8.2 |
|---|---|---|
| Hardness (Shore 00) | 71 | 64 |
| Tensile strength (psi) | 69 | 64 |
| Elongation (%) | 111 | 185 |
| Toughness (in · lbs/in$^3$) | 46 | 49 |

Specimens were also examined for heat resistance according to ASTM D 573, 180° C. for 200 hours, with the results shown below.

|  | Ex 8.1 | Ex 8.2 |
|---|---|---|
| Hardness (Shore 00) | 81 | 75 |
| Tensile strength retention (%) | 120 | 132 |
| Elongation retention (%) | 45 | 41 |
| Toughness retention (%) | 81 | 49 |

The performance properties detailed above describing Example 8 illustrate that blends of vinyl terminated fluorine containing polysiloxane and vinyl terminated phenyl substituted polysiloxane in combination with the silicon hydrocarbon crosslinker are gel materials with good strength, flexibility and heat resistance.

Comparative Example 3

A further encapsulant polymer gel was prepared from a blend of a vinyl terminated fluorine containing polysiloxane which is 50 mol % substituted with 3,3,3-trifluoropropyl groups with a vinyl terminated phenyl-substituted polysiloxane which is 15 mol % substituted with phenyl groups and a cross linking agent that is a linear hydrosiloxane with either dimethyl substitution or 3,3,3-trifluoropropyl substitution. Materials in Comparative Example 3 were formulated according to the method described in Example 1, via a two part process. Compounds B shown in Table 33 was blended with 50 wt % each of compounds A. Compound C shown in Table 33 was blended with the remaining 50 wt % each of compounds A. The two parts were mixed, de-aerated, poured into molds suitable for making test pieces and cured at 150° C. for 1 hour.

TABLE 33

| Compound | Material | CEx 3.1 | CEx 3.2 |
|---|---|---|---|
| A | Nusil PLY-7801 (%) | 65.36 | 65.36 |
|  | Nusil PLY-7664 (%) | 16.34 | 16.34 |
| B | PT-L (%) | 0.30 | 0.30 |
| C | Masil XL-1 (%) | 18.00 | — |
|  | SMP 9951-22 (%) | — | 18.00 |

Specimens were cut from each cured piece and measured for physical properties according to ASTM D2240 and ASTM D 412 (using Die D to cut the pieces and a tensile rate of 20inch/minute with the results shown below.

|  | CEx 3.1 | CEx 3.2 |
|---|---|---|
| Hardness (Shore 00) | 51.5 | 33 |
| Tensile strength (psi) | 26.4 | 16.2 |
| Elongation (%) | 134.4 | 342.4 |
| Toughness (in · lbs/in$^3$) | 14 | 27 |

Specimens were also examined for heat resistance according to ASTM D 573, 180° C. for 200 hours, with the results shown below.

|  | CEx 3.1 | CEx 3.2 |
|---|---|---|
| Hardness (Shore 00) | 84 | 54.5 |
| Tensile strength retention (%) | 256 | 121 |
| Elongation retention (%) | 14 | 41 |
| Toughness retention (%) | 25 | 17 |

The performance properties detailed above describing Comparative Example 3 illustrate that blends of vinyl terminated fluorine containing polysiloxane and vinyl terminated phenyl substituted polysiloxane in combination with cross linking agents that are linear hydrosiloxanes with either dimethyl or 3,3,3-trifluoropropyl substitution are soft gel materials with inferior strength, toughness and heat resistance compared with Example 8.

We claim:

1. A cross-linkable organosilicon polymer, comprising in the range of about 60 wt % to about 99 wt % vinyl terminated phenyl-substituted siloxane and in the range of about 1 wt % to about 40 wt % of a reactive polysiloxane resin having both reactive carbon-carbon double bonds and silicone hydrogen groups, wherein the polysiloxane resin comprises a silicon hydrocarbon crosslinking agent comprising alternating structures of polycyclic polyene residue and cyclic siloxysilane residue.

2. An organosilicon polymer according to claim 1, wherein the vinyl terminated phenyl-substituted siloxane is in the range of about 1 mole % to about 40 mole % phenyl substituted.

3. An organosilicon polymer according to claim 2, wherein the vinyl terminated phenyl-substituted siloxane is in the range of about 2 mole % to about 20 mole % phenyl substituted.

4. An organosilicon polymer according to claim 3, further comprising a group VIII metal catalyst.

5. An organosilicon polymer according to claim 4, wherein the group VIII metal catalyst is selected from the group consisting of platinum based compounds, rhodium based compounds, ruthenium based compounds, iridium based compounds, palladium based compounds and mixtures thereof.

6. An organosilicon polymer according to claim 5, wherein the group VIII metal catalyst is selected from the group consisting of chloroplatinic acid, platinum chloride, dibenzonitrile platinum dichloride, platinum on carbon, platinum on silica, platinum on alumina. olefinic complexes, RhCl(PPh$_3$)$_3$, RhCl(CO)(PPh$_3$)$_2$, Ru$_3$(CO)$_{12}$, IrCl(CO)(PPh$_3$)$_4$, Pd(PPh$_3$)$_4$,and mixtures thereof.

7. An organosilicon polymer according to claim 4, wherein the polymer further comprises an additive selected from the group consisting of antioxidants, compatabilizing agents, metallic, mineral and organic fillers, flow control agents, air release agents, adhesion promoters, cure rate modifiers and mixtures thereof.

* * * * *